(12) United States Patent
Zhang et al.

(10) Patent No.: US 11,894,850 B1
(45) Date of Patent: Feb. 6, 2024

(54) DELAY CIRCUITS AND SEMICONDUCTOR DEVICES

(71) Applicant: ChangXin Memory Technologies, Inc., Hefei (CN)

(72) Inventors: Xinxin Zhang, Hefei (CN); Jianyong Qin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 18/180,018

(22) Filed: Mar. 7, 2023

(30) Foreign Application Priority Data

Sep. 16, 2022 (CN) .......................... 202211127975.1

(51) Int. Cl.
*H03K 5/00* (2006.01)
*H03K 5/01* (2006.01)
*G05F 1/567* (2006.01)

(52) U.S. Cl.
CPC .............. *H03K 5/01* (2013.01); *G05F 1/567* (2013.01); *H03K 2005/00019* (2013.01)

(58) Field of Classification Search
CPC . H03K 5/01; H03K 2005/00019; G05F 1/567
USPC ......................................................... 327/261
See application file for complete search history.

(56) References Cited

U.S. PATENT DOCUMENTS

| | | | | |
|---|---|---|---|---|
| 5,136,260 A | * | 8/1992 | Yousefi-Elezei | H03L 7/23 331/25 |
| 5,180,995 A | * | 1/1993 | Hayashi | H03K 3/0315 331/186 |
| 5,440,277 A | * | 8/1995 | Ewen | G05F 3/205 327/543 |
| 6,496,056 B1 | * | 12/2002 | Shoji | H03K 3/011 327/543 |
| 6,667,925 B2 | * | 12/2003 | Kobayashi | G11C 7/04 365/189.11 |
| 6,759,875 B2 | * | 7/2004 | Mano | H03K 3/0315 327/158 |
| 6,901,022 B2 | * | 5/2005 | Fiscus | G11C 5/147 327/512 |
| 7,397,315 B2 | * | 7/2008 | Kishida | H03K 3/0315 331/74 |
| 7,589,583 B2 | * | 9/2009 | Yoshikawa | G11C 5/145 327/536 |

(Continued)

FOREIGN PATENT DOCUMENTS

CN 103684354 A 3/2014

*Primary Examiner* — Ryan Jager
(74) *Attorney, Agent, or Firm* — Alston & Bird LLP

(57) ABSTRACT

The present disclosure provides a delay circuit and a semiconductor device. The delay circuit includes a delay unit and a linear voltage regulator unit; wherein, the delay unit includes an inverting unit and a power supply control unit, and the inverting unit includes an inverting unit and a power supply control unit. The inversion unit receives an input signal and delays the input signal, and the power supply control unit is used for providing a voltage to the inverting unit according to the power supply control signal; the linear voltage stabilization unit is coupled to the delay unit and outputting the power supply control signal according to a reference voltage. The voltage outputs the power control signal. The present disclosure can accurately control the delay time of the delay unit and improve the delay precision of the delay circuit.

15 Claims, 11 Drawing Sheets

(56) References Cited

U.S. PATENT DOCUMENTS

| | | | | |
|---|---|---|---|---|
| 7,834,683 B2* | 11/2010 | Truong | ................ | G05F 3/247 |
| | | | | 327/543 |
| 8,384,470 B2* | 2/2013 | Sugiura | ................ | G05F 3/242 |
| | | | | 327/541 |
| 8,581,667 B2* | 11/2013 | Navubothu | ........... | H03L 7/0995 |
| | | | | 331/34 |
| 9,300,247 B2* | 3/2016 | Roine | ................ | H03B 5/24 |
| 9,473,149 B1* | 10/2016 | Zhang | ................ | H03L 1/022 |
| 9,692,396 B2* | 6/2017 | Yu | ................ | H03K 3/011 |
| 10,630,267 B2* | 4/2020 | Tripoli | ................ | H03K 3/0315 |
| 10,992,288 B2* | 4/2021 | Zou | ................ | H03K 3/012 |
| 2006/0226921 A1* | 10/2006 | Hsu | ................ | H03K 3/0315 |
| | | | | 331/57 |
| 2022/0407506 A1* | 12/2022 | Fiedler | ................ | G06F 1/10 |

\* cited by examiner discharge current curves

DELAY CIRCUITS AND SEMICONDUCTOR DEVICES

TECHNICAL FIELD

The present disclosure relates to the technical field of electronic circuits, and in particular, to a delay circuit and a semiconductor device.

BACKGROUND

A delay circuit can be used to delay the rising edge and/or the falling edge of a pulse signal, and has been widely used in integrated circuits.

In the related art, the delay time of a delay circuit is affected by temperature, voltage, etc., which makes it difficult for the existing delay circuit to accurately control the delay time, so the delay accuracy is not high.

SUMMARY

The present disclosure provides a delay circuit and a semiconductor device, which can accurately control the delay time and improve the delay precision.

In a first aspect, an embodiment of the present disclosure provides a delay circuit, including:
  a delay unit, the delay unit includes an inversion unit and a power supply control unit, the inversion unit is used for receiving an input signal and delaying the input signal, and the power supply control unit is used for sending the input signal to the inverting unit provides a voltage; and
  a linear voltage stabilization unit, which is coupled to the delay unit and used for outputting the power supply control signal according to a reference voltage.

In some embodiments, the inverting unit includes a first transistor, a second transistor and a first capacitor, and the channel types of the first transistor and the second transistor are different.

The gate of the first transistor is connected to the gate of the second transistor and receives the input signal, the drain of the first transistor is connected to the drain of the second transistor and serves as the output of the delay unit terminal, the source of the first transistor and/or the source of the second transistor receives the voltage; one terminal of the first capacitor is connected to the output terminal of the delay unit, and the first capacitor is connected to the output terminal of the delay unit. The other end is grounded.

In some embodiments, the power control unit includes a first power control unit and/or a second power control unit.

The first power supply control unit is configured to provide a power supply voltage to the source of the first transistor according to a first power supply control signal.

The second power control unit is configured to provide a ground voltage to the source of the second transistor according to a second power control signal.

In some embodiments, the first power supply control unit includes a third transistor, the channel types of the third transistor and the first transistor are the same, the source of the third transistor is connected to the first power supply, and the drain is connected to the first power supply. The electrode is connected to the source electrode of the first transistor, and the gate electrode is used for receiving the first power supply control signal.

The second power control unit includes a fourth transistor, the channel types of the fourth transistor and the second transistor are the same, the source of the fourth transistor is grounded, and the drain is the same as the source of the second transistor connected, and the gate is used for receiving the second power control signal.

In some embodiments, the first power supply is powered by a low dropout linear regulator, and the input reference voltage of the low dropout linear regulator adopts a bandgap reference voltage.

In some embodiments, the reference voltage includes a positive temperature coefficient voltage and/or a negative temperature coefficient voltage.

In some embodiments, the delay circuit further includes a temperature coefficient voltage generating circuit configured to receive a zero temperature coefficient current and generate the positive temperature coefficient voltage and/or the negative temperature coefficient voltage.

In some embodiments, the zero temperature coefficient current is formed using a positive temperature coefficient current and a negative temperature coefficient current, and the zero temperature coefficient current does not vary with temperature.

In some embodiments, the temperature coefficient voltage generation circuit includes a first NMOS, a second NMOS and a PMOS.

The gate of the first NMOS is connected to the gate of the second NMOS, the source of the first NMOS is grounded, the drain of the first NMOS and the connection between the first NMOS and the second NMOS a common-connected gate for receiving the zero temperature coefficient current.

The source of the second NMOS is grounded, the drain of the second NMOS is connected to the drain and the gate of the PMOS, respectively, and the common gate of the first NMOS and the second NMOS is used for output the negative temperature coefficient voltage.

The source of the PMOS is connected to a preset voltage, and the gate of the PMOS is used to output the positive temperature coefficient voltage.

In some embodiments, the linear voltage regulator unit is configured to output the first power supply control signal according to the positive temperature coefficient voltage, and/or output the second power supply control signal according to the negative temperature coefficient voltage.

In some embodiments, the linear voltage regulator unit includes a first output terminal and/or a second output terminal, the first output terminal is used for outputting the first power supply control signal, and the second output terminal is used for outputting the first power supply control signal. outputting the second power control signal.

The delay circuit includes a second capacitor and/or a third capacitor, a first end of the second capacitor is connected to the first output end, and a second end of the second capacitor is grounded.

The first end of the third capacitor is connected to the second output end, and the second end of the second capacitor is grounded.

In some embodiments, the linear voltage regulator unit includes a voltage follower circuit.

In some embodiments, when the delay circuit includes N delay units, the delay circuit includes N linear voltage stabilization units, and different linear voltage stabilization units are coupled to the different delay unit; wherein, N is an integer greater than 1.

In some implementation manners, when the delay circuit includes N delay units, the delay circuit includes M linear voltage stabilization units, and each of the linear voltage stabilization units is respectively coupled to P wherein, N is an integer greater than 1, and N is a multiple of M, and P=M/N.

In some embodiments, when the delay circuit includes a plurality of the delay units, the linear voltage stabilization unit includes a first linear voltage stabilization unit, a second linear voltage stabilization unit, and a control circuit.

The first linear voltage stabilization unit is in an on state; the control circuit is used to control whether the second linear voltage stabilization unit is turned on.

In a second aspect, an embodiment of the present disclosure provides a semiconductor device, including a delay circuit, where the delay circuit is the delay circuit provided in the first aspect.

The delay circuit provided by the embodiment of the present disclosure includes a delay unit and a linear voltage stabilization unit, the delay unit includes an inversion unit and a power supply control unit, the linear voltage stabilization unit provides a power supply control signal to the delay unit, and the power control unit provides voltage to the inverter unit according to the power control signal, which can accurately control the delay time of the delay circuit and improve the delay accuracy of the delay circuit.

DETAILED DESCRIPTION OF THE PREFERRED EMBODIMENTS

Figure 1:
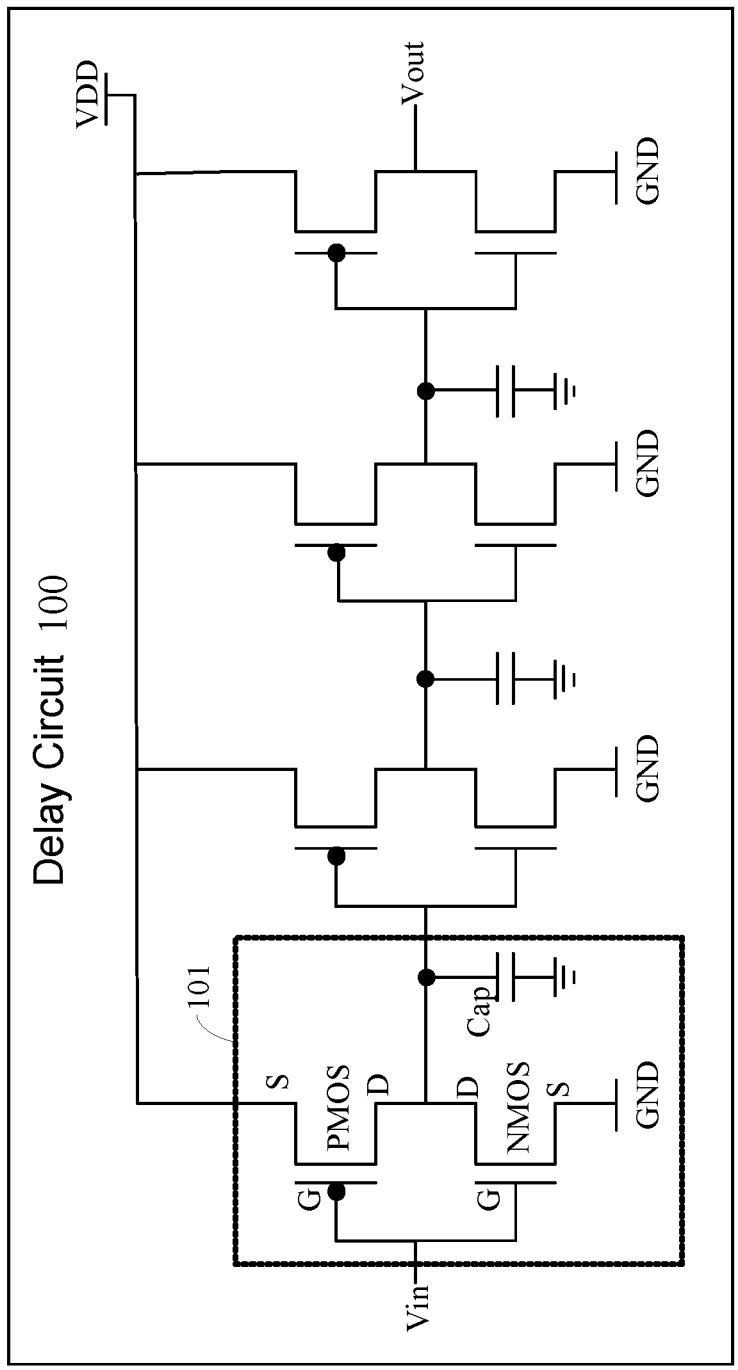
FIG. 1 is a schematic circuit diagram of a delay circuit 100 according to an embodiment of the present disclosure.

To explain the purposes, technical solutions and advantages of the embodiments of the present disclosure with clarity, the embodiments of the present disclosure will be described clearly and completely below with reference to the accompanying drawings in the embodiments of the present disclosure. Obviously, the described embodiments are only some, but not all, embodiments of the present disclosure. Based on the embodiments in the present disclosure, all other embodiments obtained by those of ordinary skill in the art without creative efforts shall fall within the protection scope of the present disclosure. Furthermore, although the disclosures in this disclosure have been presented in terms of illustrative example or instances, it should be understood that various aspects of this disclosure may also constitute a complete embodiment in isolation.

It should be noted that the brief description of terms in the present disclosure is only for the convenience of understanding the embodiments described below, rather than intended to limit the embodiments of the present disclosure. Unless otherwise specified, these terms are to be understood according to their ordinary and ordinary meanings.

The terms "first", "second" and the like in the description and claims of the present disclosure and the above drawings are used to distinguish similar or similar objects or entities, and are not necessarily meant to limit a specific order or sequence. unless otherwise noted. It is to be understood that the terms so used are interchangeable under appropriate circumstances, eg, can be implemented in an order other than those presented in the illustrations or descriptions of embodiments in accordance with the present disclosure.

Furthermore, the terms "comprising" and "having" and any variations thereof, are intended to cover but not exclusively include, for example, a product or device incorporating a series of components is not necessarily limited to those explicitly listed, but may include No other components are expressly listed or inherent to these products or devices.

The term "module" used in the embodiments of the present disclosure refers to any known or later developed hardware, software, firmware, artificial intelligence, fuzzy logic, or combination of hardware or/and software codes capable of performing the functions associated with the element.

It should be understood that the term "and/or" used in this document is only an association relationship to describe the associated objects, indicating that there may be three kinds of relationships, for example, A and/or B, which may indicate that A exists alone, and A and B exist at the same time. A alone, B alone, there are three cases. In addition, the character "/" in this document generally indicates that the related objects are an "or" relationship.

According to the channel type, MOS can include PMOS (P-channel type) and NMOS (N-channel type). Among them, MOS includes four terminals such as gate (G), source (S), drain (D) and substrate (bulk). For NMOS, when the connection between gate (G) and source (S) when the voltage Vgs is greater than a certain value, the NMOS will be turned on. For PMOS, when the voltage Vgs between the gate (G) and the source (S) is less than a certain value, the PMOS will be turned on.

MOS is widely used in the field of semiconductor technology. For example, a series connection of PMOS and NMOS can form an inverter (or called a NOT gate), and the inverter has a certain delay effect on the rising edge signal or the falling edge signal.

In some embodiments, a capacitor may also be provided between the input terminal and the output terminal of the inverter, so as to further prolong the time for the rising edge signal or the falling edge signal to reach the output terminal.

Referring to FIG. 1, FIG. 1 is a schematic circuit diagram of a delay circuit 100 according to an embodiment of the present disclosure. In FIG. 1, the above-mentioned delay circuit 100 includes a plurality of delay units 101, and each delay unit 101 includes a PMOS, an NMOS and a capacitor Cap. The gate (G) of the PMOS is connected to the gate (G) of the NMOS, and the common gate of the PMOS and the NMOS is the input terminal Vin of the delay unit 101; the drain (D) of the PMOS and the drain of the NMOS (D) connection, and the common drain of PMOS and NMOS is the output terminal Vout of the delay unit 101; the source (S)

of the PMOS is connected to the power supply VDD, and the source (S) of the NMOS is grounded (GND); the capacitor Cap has one end connected to the output end of the delay unit 101, and the other end grounded.

Wherein, each delay unit 101 can realize different delay times by adjusting the capacitance value of the internal capacitor Cap. However, since the charging and discharging current of the capacitor is affected by temperature, voltage, etc., it is difficult for the existing delay units to accurately control the delay time, and the delay accuracy is not high.

Faced with the above technical problems, the embodiments of the present disclosure provide a delay circuit, which can accurately control the delay time and improve the delay accuracy. For the specific implementation, please refer to the following embodiments.

Figure 2:
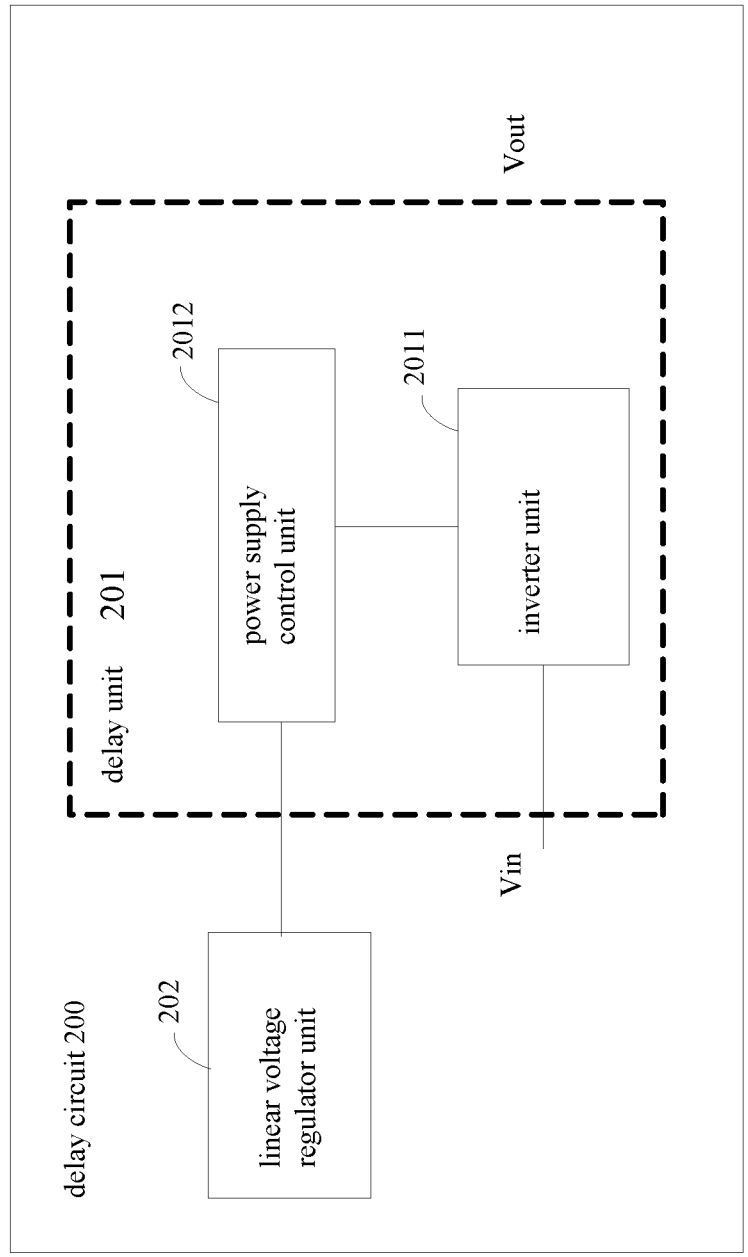
FIG. 2 is a schematic block diagram of a delay circuit 200 according to an embodiment of the present disclosure.

Referring to FIG. 2, FIG. 2 is block diagram of a delay circuit 200 according to an embodiment of the present disclosure. In FIG. 2, the above-mentioned delay circuit 200 includes a delay unit 201 and a linear voltage regulator unit 202, and the delay unit 201 includes an inverting unit 2011 and a power control unit 2012.

The inverting unit 2011 is used for receiving the input signal and delaying the input signal. For example, the inverting unit 2011 can prolong the time from the input terminal Vin to the output terminal Vout of the rising edge signal or the falling edge signal.

The power control unit 2012 is used for supplying a voltage to the inverter unit 2011 according to the power control signal.

In some embodiments, the inverting unit 2011 may be composed of a PMOS and an NMOS in series. For example, the common gate of the PMOS and NMOS in the inverting unit 2011 is the input terminal Vin of the inverting unit 2011 of the delay unit. The common drain of the PMOS and NMOS is the output terminal Vout of the inverting unit 2011 of the delay unit.

Optionally, the power control unit 2012 can be used to provide voltage to the source of the PMOS in the inverting unit 2011; alternatively, the power control unit 2012 can also be used to provide voltage to the source of the NMOS in the inverting unit 2011; and then alternatively, the power control unit 2012 may also be used to provide voltages for the source of the PMOS and the source of the NMOS in the inverting unit 2011 at the same time, which is not limited in this embodiment of the present disclosure.

In some embodiments, the linear voltage regulator unit 202 is coupled to the delay unit 201. The linear voltage regulator unit 202 can output the above-mentioned power control signal according to the reference voltage. That is, the linear voltage regulator unit 202 can control the power control unit 2012 to be turned on and off according to the reference voltage.

Exemplarily, the above-mentioned power supply control unit 2012 may include PMOS and/or NMOS, and the linear voltage regulator unit 202 may provide a power supply control signal to the gate of the PMOS and/or NMOS according to the reference voltage, so as to control the conduction of the PMOS and/or the NMOS. with off.

The delay circuit 200 provided by the embodiment of the present disclosure provides a power supply control signal to the delay unit 201 through the linear voltage regulator unit 202, and provides a voltage to the inverter unit 2011 through the power supply control unit 2012 according to the power supply control signal, which can accurately control The delay time of the delay circuit 200 can improve the delay precision of the delay circuit.

Figure 3:
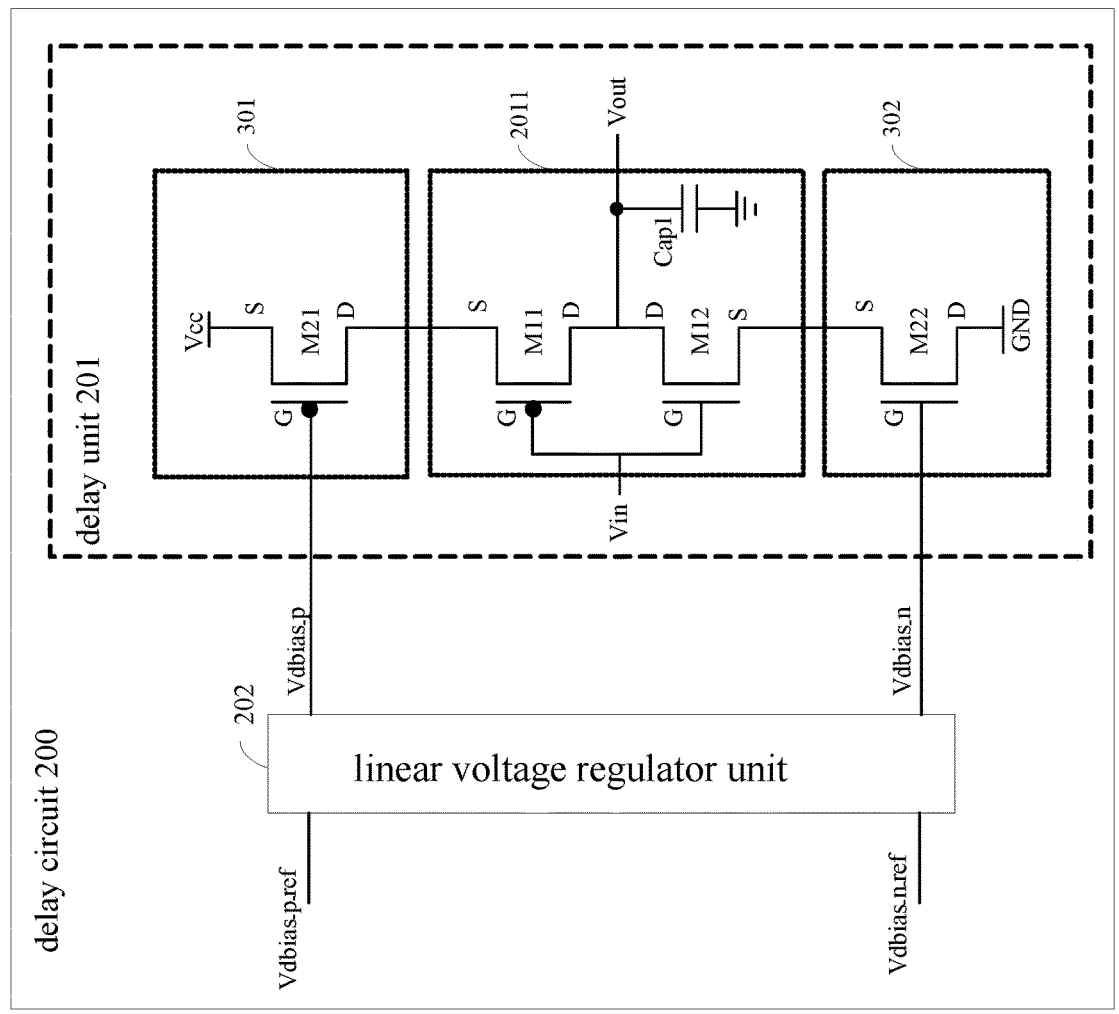
FIG. 3 is another schematic block diagram of a delay circuit 200 according to an embodiment of the present disclosure.

Referring to FIG. 3, FIG. 3 is another schematic block diagram of a delay circuit 200 according to an embodiment of the present disclosure. In FIG. 3, the above-mentioned delay circuit 200 includes a delay unit 201 and a linear voltage regulator unit 202, and the delay unit 201 includes an inverting unit 2011 and a power supply control unit.

The inverting unit 2011 includes a first transistor M11, a second transistor M12 and a first capacitor Cap1. The channel types of the first transistor M11 and the second transistor M12 are different, for example, the first transistor M11 is a PMOS, and the second transistor M12 is an NMOS.

The gate (G) of the first transistor M11 is connected to the gate (G) of the second transistor M12 and serves as the input terminal of the delay unit 201 to receive the input signal, and the drain (D) of the first transistor M11 is connected to the second transistor The drain (D) of M12 is used as the output terminal of the delay unit 201, and the source (S) of the first transistor M11 and/or the source (S) of the second transistor receives the voltage provided by the above-mentioned power supply control unit; the first end of the capacitor Cap1 is connected to the output end of the delay unit 201, and the other end of the first capacitor Cap1 is grounded.

Optionally, in some embodiments, the above-mentioned power supply control unit includes a first power supply control unit 301 and/or a second power supply control unit 302.

Wherein, the first power supply control unit 301 is used for providing a power supply voltage to the source (S) of the first transistor M11 according to the first power supply control signal Vdbias-p; the second power supply control unit 302 is used for according to the second power supply control signal Vdbias-p n supplies the ground voltage to the source (S) of the second transistor M12.

It should be noted that, in some embodiments, the above-mentioned power supply control unit may include only the first power supply control unit 301 or only the second power supply control unit 302, and in other embodiments, the above-mentioned power supply control unit may include the first power supply control unit at the same time. Power control unit 301 and second power control unit 302. For example, when the above-mentioned power control unit only includes the first power control unit 301, the source (S) of the second transistor M12 can be directly grounded; when the above-mentioned power control unit only includes the second power control unit 302, the first transistor M11 The source(s) can be directly connected to the preset power supply VDD.

Optionally, in some embodiments, the first power control unit 301 includes a third transistor M21, and the channel types of the third transistor M21 and the first transistor M11 are the same. For example, when the first transistor M11 is a PMOS, the third transistor M21 is also a PMOS.

The source (S) of the third transistor M21 is connected to the first power supply Vcc, the drain (D) is connected to the source (S) of the first transistor M11, and the gate (G) is used to receive the first power supply control signal Vdbias-p.

The second power control unit 302 includes a fourth transistor M22. The channel types of the fourth transistor M22 and the second transistor M12 are the same. For example, when the second transistor M12 is an NMOS, the fourth transistor M22 is also an NMOS.

The source (S) of the fourth transistor M22 is grounded, the drain (D) is connected to the source (S) of M12 of the second transistor, and the gate (G) is used to receive the second power control signal Vdbias-n.

It can be understood that, setting the third transistor M21 and the fourth transistor M22 in the delay unit 201 can effectively reduce the discharge current and the charging current of the inverting unit 2011.

Figure 4:
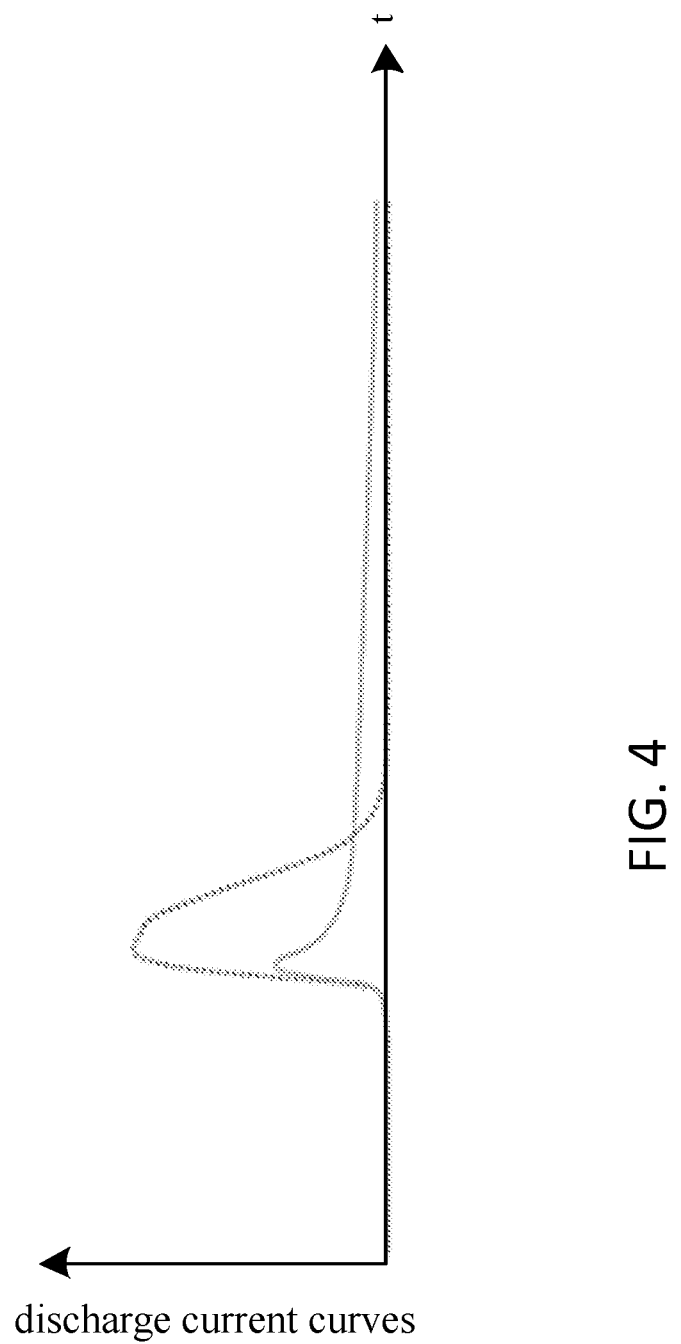
FIG. 4 is a chart comparing the discharge current curves of the inverter unit 2011 according to the embodiment of the disclosure.

For a better understanding of the embodiment of the present disclosure, refer to FIG. 4, which is a chart comparing the discharge current curves of the inverter unit 2011 according to the embodiment of the present disclosure.

In FIG. 4, the dotted line represents the change curve of the discharge current of the inverter unit 2011 when the third transistor M21 and the fourth transistor M22 are not introduced; the solid line represents the discharge current of the inverter unit 2011 when the third transistor M21 and the fourth transistor M22 are introduced. Curve.

It can be seen from FIG. 4 that the discharge current of the inverting unit 2011 is relatively large when the third transistor M21 and the fourth transistor M22 are not introduced, and the delay time of the inverting unit 2011 is also relatively large at this time; when M21 and the fourth transistor M22 supply voltage to the inverting unit 2011, the discharge current of the inverting unit 2011 will be significantly reduced, and the delay time of the inverting unit 2011 will also be significantly reduced at this time, so that the delay of the inverting unit 2011 will be significantly reduced. more refined and easier to control.

Similarly, when the third transistor M21 and the fourth transistor M22 are introduced to provide voltage to the inverting unit 2011, the charging current of the inverting unit 2011 will also be significantly reduced.

In some embodiments, the linear voltage regulator unit 202 may output the first power control signal Vdbias-p based on the reference voltage Vdbias-p-ref, and output the second power control signal Vdbias-n based on the reference voltage Vdbias-n-ref.

In some embodiments, the reference voltage Vdbias-p-ref is a positive temperature coefficient voltage, and the reference voltage Vdbias-n-ref is a negative temperature coefficient voltage.

Among them, taking the third transistor M21 as a PMOS as an example, the current I on the PMOS and the gate-source voltage of the PMOS (Vgs, which is a negative value when turned on) are proportional to the threshold voltage (Vth, which is a negative value). The gate voltage Vdibas_p_ref of the PMOS is a positive temperature coefficient voltage. Therefore, when the threshold voltage of the PMOS increases with temperature, the gate voltage Vdibas_p_ref of the PMOS also increases with the temperature. Under the same condition, the difference between the gate-source voltage (Vgs) and the threshold voltage (Vth) of the PMOS will not increase with the increase of temperature. Therefore, the first power supply control signal Vdbias-p received by the gate of the third transistor M21 is also a voltage with a positive temperature coefficient, and the threshold voltage of the third transistor M21 also increases with the increase of temperature, but flows through the third transistor M21 The current I is a constant current independent of temperature changes, that is, through the linear voltage regulator unit 202, the PMOS and the third transistor M21 are equivalent to forming a current mirror.

Similarly, the fourth transistor M22 is an NMOS as an example, the current I on the NMOS and the difference between the gate-source voltage (Vgs) of the NMOS and the threshold voltage (Vth) are proportional, since the gate voltage Vdibas_n_ref of the NMOS is a negative temperature coefficient voltage, therefore, when the threshold voltage of NMOS decreases with the increase of temperature, the gate voltage Vdibas_n_ref of NMOS also decreases with the increase of temperature. When the source voltage of NMOS remains unchanged, the gate-source voltage of NMOS (Vgs) and the threshold voltage (Vth) does not decrease with increasing temperature. Therefore, the current I flowing through the fourth transistor M22 is also a constant current independent of temperature changes.

It can be understood that, the delay unit 201 usually realizes different delay times by adjusting the capacitance value of the internal capacitor Cap1. Since the charging and discharging current of the capacitor is mainly affected by temperature and voltage, the delay time of the delay unit 201 is mainly affected by temperature and voltage factors.

In this embodiment, by introducing the temperature-related positive temperature coefficient voltage and negative temperature coefficient voltage into the delay unit 201, the threshold voltages of the third transistor M21 and the fourth transistor M22 can be counteracted by the temperature change, so that the inflow The current of the inverting unit 2011 will not change with temperature changes, so that the charge and discharge current of Cap1 in the inverting unit 2011 can be kept constant, thereby eliminating the influence of temperature changes on the delay time of the delay unit 201 and increasing the delay. Delay accuracy of unit 201.

In some embodiments, the first power supply Vcc may be powered by a low dropout linear regulator (LDO), and the input reference voltage of the low dropout linear regulator adopts a bandgap reference voltage.

Among them, LDO is a low-dropout linear regulator with low power consumption, which usually has extremely low self-noise and high power supply rejection ratio (PSRR).

Optionally, the interior of the LDO can be composed of four major components, namely a voltage divider sampling circuit, a reference voltage, an error amplifier circuit and a transistor adjustment circuit. Among them, the voltage divider sampling circuit is used to collect the output voltage through the resistance; the error amplifier circuit is used to input the collected voltage to the reverse input terminal of the comparator, compare it with the reference voltage of the forward input terminal, and then amplify the comparison result.; The transistor adjustment circuit is used to output the amplified signal to the control electrode of the transistor, so that the on-voltage of the transistor can be controlled by the amplified signal (electric current).

Figure 5:
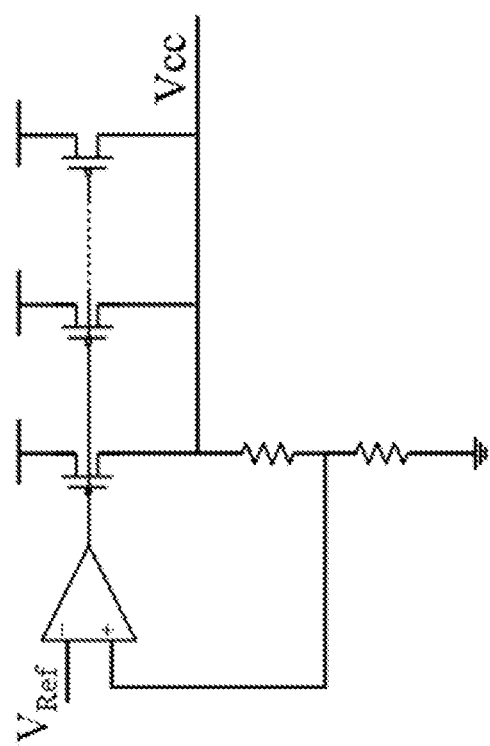
FIG. 5 is a schematic circuit diagram of a low dropout linear voltage regulator according to an embodiment of the present disclosure.

For a better understanding of the embodiments of the present disclosure, refer to FIG. 5, which is a schematic circuit diagram of a low dropout linear voltage regulator according to an embodiment of the present disclosure.

In some embodiments, the input reference voltage $V_{Ref}$ of the above-mentioned low dropout linear regulator adopts a bandgap reference voltage.

The above-mentioned bandgap reference voltage is not affected by power supply voltage and temperature.

It can be understood that the input reference voltage $V_{Ref}$ of the above-mentioned low-dropout linear regulator adopts the bandgap reference voltage, which can ensure that the generated Vcc voltage will not fluctuate with the fluctuation of temperature and voltage, thereby making the delay time of the delay unit 201 longer. It will not be affected by the fluctuation of the power supply voltage, thereby effectively improving the delay accuracy of the delay circuit 200.

In the delay circuit provided by the embodiment of the present disclosure, the linear voltage regulator unit 202 provides a power supply control signal to the delay unit 201, and the power supply control unit provides a voltage to the inverter unit 2011 according to the power supply control signal, which can effectively eliminate the temperature changes and voltage fluctuations affect the delay duration of the delay unit 201, thereby improving the delay accuracy of the delay circuit 200.

Figure 6:
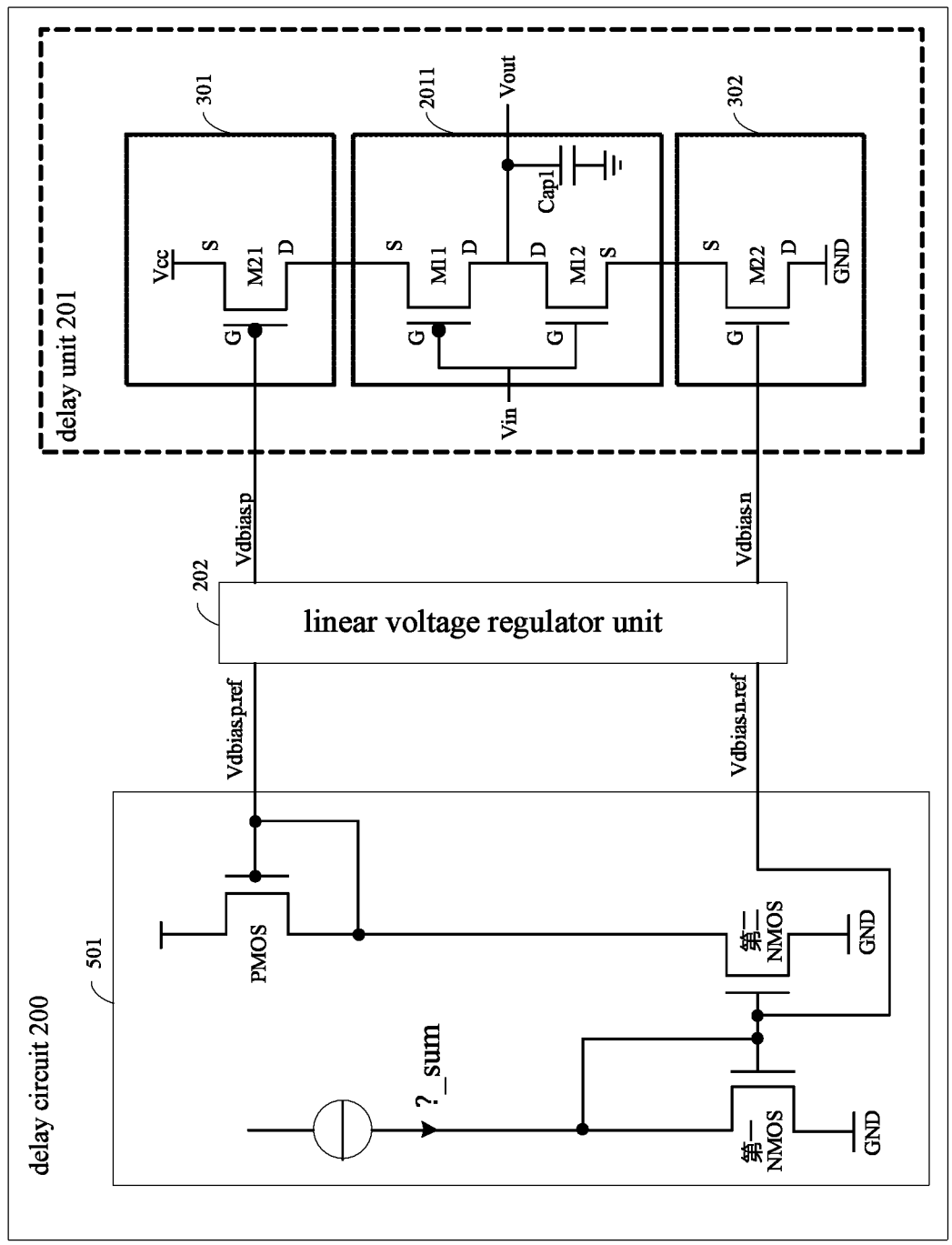
FIG. 6 is another schematic circuit diagram of a delay circuit 200 according to an embodiment of the present disclosure.

Based on the content described in the foregoing embodiments, referring to FIG. 6, FIG. 6 is another schematic circuit diagram of a delay circuit 200 according to an embodiment of the present disclosure. In FIG. 6, the above-mentioned delay circuit 200 includes a delay unit 201, a linear voltage regulator unit 202 and a temperature coefficient voltage generation circuit 501, and the delay unit 201 includes an inverting unit 2011 and a power supply control unit.

The detailed structures of the inverting unit 2011, the power control unit and the linear voltage regulator unit 202 may refer to the embodiments shown in FIG. 3 and FIG. 5, which will not be repeated here.

The temperature coefficient voltage generating circuit 501 is configured to receive the zero temperature coefficient current I_sum, and generate a positive temperature coefficient voltage and/or a negative temperature coefficient voltage according to the zero temperature coefficient current I_sum. The positive temperature coefficient voltage is the reference voltage Vdbias-p-ref, and the negative temperature coefficient voltage is the reference voltage Vdbias-n-ref.

In some embodiments, the zero temperature coefficient current I_sum is formed using a positive temperature coefficient current and a negative temperature coefficient current, which does not vary with temperature.

Exemplarily, I_sum=a·Iptat+b·Ictat.

Among them, Iptat represents the positive temperature coefficient current, Ictat represents the negative temperature coefficient current, and a and b are non-zero natural numbers.

In some embodiments, the temperature coefficient voltage generating circuit includes a first NMOS, a second NMOS and a PMOS; the gate of the first NMOS is connected to the gate of the second NMOS, the source of the first NMOS is grounded, and the drain of the first NMOS is connected to the ground. electrode and the common gate of the first NMOS and the second NMOS are used to receive the zero temperature coefficient current I_sum; the source of the second NMOS is grounded, the drain of the second NMOS is connected to the drain and gate of the PMOS respectively, the first common gate of the NMOS and the second NMOS is used to output the negative temperature coefficient voltage Vdbias-n-ref; the source of the PMOS is connected to the preset voltage, and the gate of the PMOS is used to output the positive temperature coefficient voltage Vdbias-p-ref.

In some embodiments. The linear voltage regulator unit 202 generates a power supply control signal Vdbias-p according to the positive temperature coefficient voltage Vdbias-p-ref, and the power supply control signal Vdbias-p is used as the input voltage of the third transistor M21; the linear voltage regulator unit 202 is based on the negative temperature coefficient voltage Vdbias. -n-ref generates the power control signal Vdbias-n, which is used as the input voltage of the fourth transistor M22.

Wherein, the linear voltage regulator unit 202 includes a voltage follower circuit.

Figure 7:
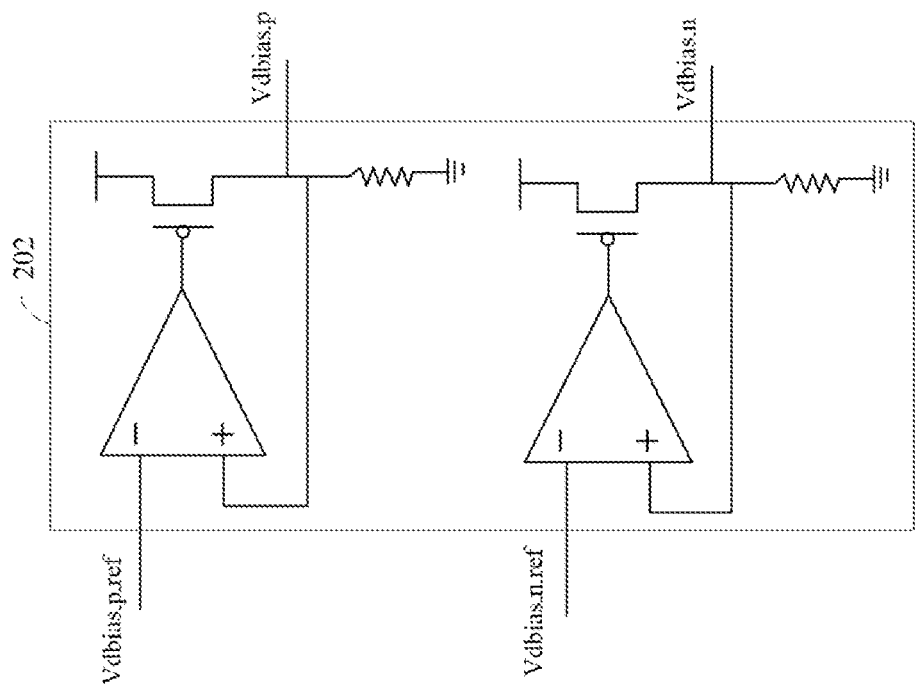
FIG. 7 is a schematic circuit diagram of a linear voltage regulator unit 202 according to an embodiment of the present disclosure.

For a better understanding of the embodiment of the present disclosure, refer to FIG. 7, which is a schematic circuit diagram of a linear voltage regulator unit 202 according to an embodiment of the present disclosure.

In some embodiments, the linear voltage regulator unit 202 may output the first power supply control signal Vdbias-p according to the positive temperature coefficient voltage Vdbias-p-ref, and/or output the second power supply according to the negative temperature coefficient voltage Vdbias-n-ref Control signal Vdbias-n.

The embodiments of the present disclosure provide the above-mentioned temperature coefficient voltage generation circuit 501 and linear voltage regulator unit 202, which can introduce zero temperature coefficient current into the delay unit 201, thereby avoiding the influence of temperature on the delay time of the delay unit 201. In some embodiments, it can be understood that if the linear voltage regulator unit 202 is not used, the positive temperature coefficient voltage Vdbias-p-ref and/or the negative temperature coefficient voltage generated in the temperature coefficient voltage generating circuit 501 are directly, if Vdbias-n-ref is provided to the delay unit 201, the delay accuracy of the delay unit 201 will be affected.

Figure 8:
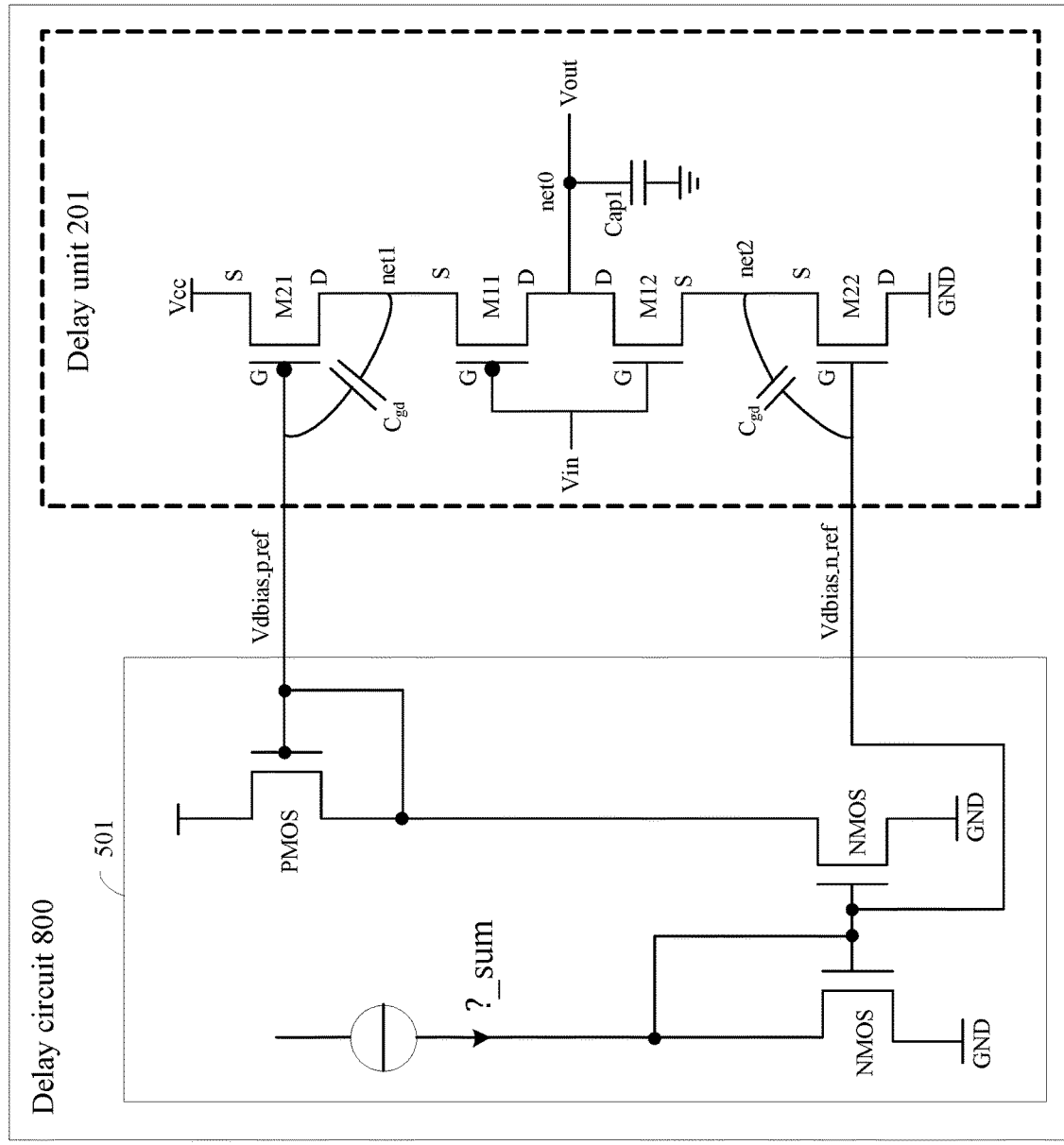
FIG. 8 is a schematic circuit diagram of a delay circuit 800 according to an embodiment of the present disclosure.

Referring to FIG. 8, FIG. 8 is a schematic circuit diagram of a delay circuit 800 according to an embodiment of the present disclosure.

As shown in FIG. 8, when the input terminal of the delay unit 201 changes from a low level to a high level, the second transistor M12 is turned on, and the net0 node starts to discharge, and changes from a high level to a low level. During the discharging process, the net2 node is charged, causing the net2 node voltage to rise, and the net node voltage rise will be coupled to the negative temperature coefficient voltage Vdbias_n-ref through the parasitic capacitance Cgd between the gate and drain of the fourth transistor M22. Ultimately, the reaction is the kickback noise of the negative temperature coefficient voltage Vdbias_n-ref. Similarly, the kickback noise is also coupled to the positive temperature coefficient voltage Vdbias_p-ref.

Among them, when the positive temperature coefficient voltage Vdbias_p-ref and the negative temperature coefficient voltage Vdbias_n-ref are simultaneously provided to multiple delay units, the noise coupled to the positive temperature coefficient voltage Vdbias_p-ref and the negative temperature coefficient voltage Vdbias_n-ref will eventually affect delay accuracy of other delay units.

In the delay circuit provided in this embodiment, since the voltage follower in the linear voltage regulator unit 202 has a good load-carrying capability, the linear voltage regulator unit 202 is used to output the positive temperature coefficient voltage Vd bias p-ref as the first power supply control signal Vd bias-p outputs the negative temperature coefficient voltage Vd bias-n-ref as the second power supply control signal Vdbias-n, which can not only introduce a temperature-independent constant current into the delay unit 201, but also improve the delay circuit For the drive capability of the delay unit 201.

In some embodiments, the above-mentioned delay circuit may further include a plurality of delay units. Wherein, when the delay circuit includes N delay units, the delay circuit may include N linear voltage stabilization units, and different linear voltage stabilization units are coupled to different delay units, wherein, N is an integer greater than 1.

Figure 9:
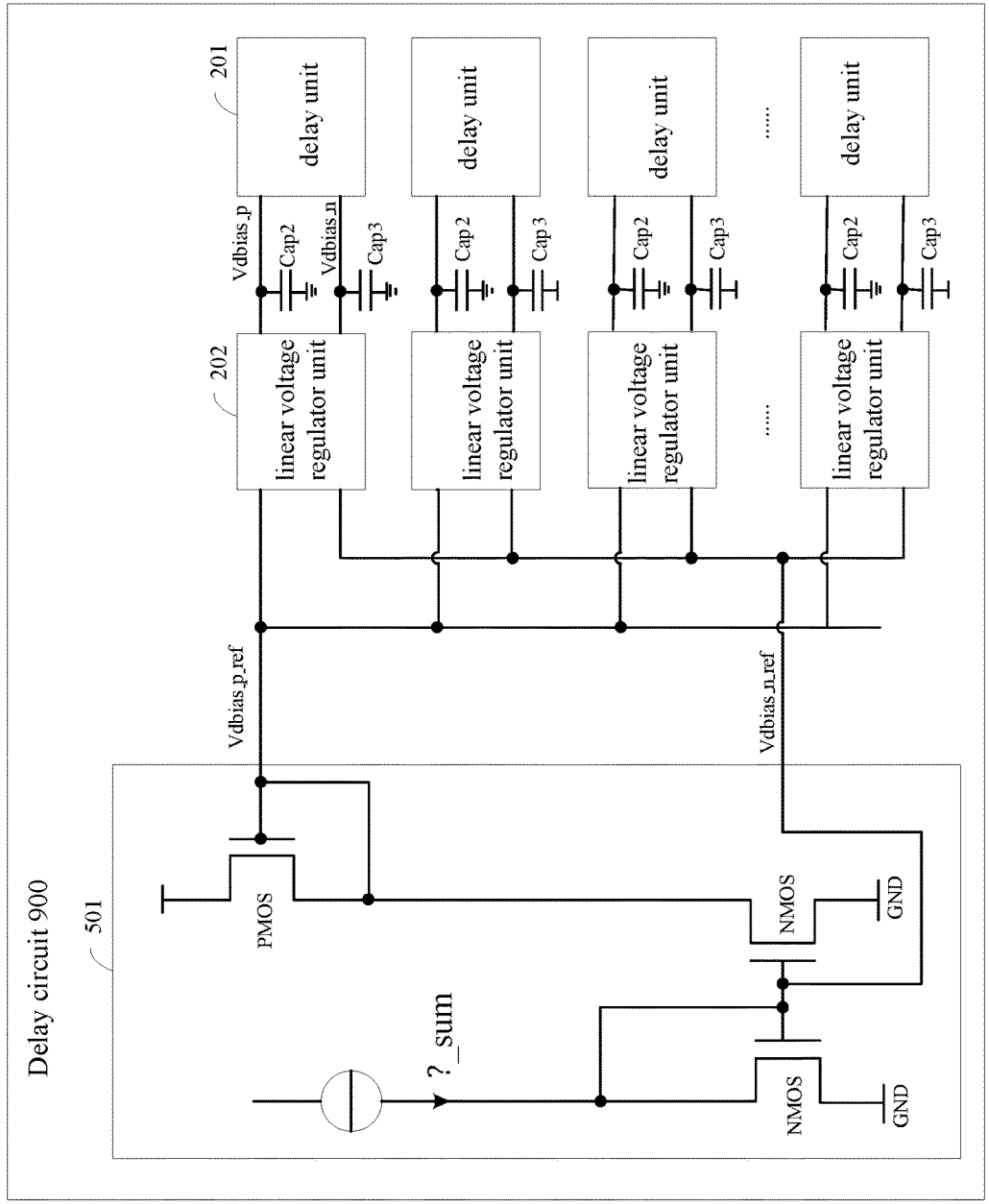
FIG. 9 is a schematic block diagram of a delay circuit 900 according to an embodiment of the present disclosure.

For a better understanding of the embodiments of the present disclosure, refer to FIG. 9, which is a schematic block diagram of a delay circuit 900 according to an embodiment of the present disclosure.

In FIG. 9, the detailed structures of the temperature coefficient voltage generating circuit 501, the linear voltage regulator unit 202 and the delay unit 201 may refer to the contents described in the above embodiments, which will not be repeated here.

In some embodiments, the linear voltage regulator unit 202 includes a first output terminal and/or a second output terminal, the first output terminal is used for outputting the first power control signal Vdbias-p, and the second output terminal is used for outputting the second power supply Control signal Vdbias-n.

The above-mentioned delay circuit 900 further includes a second capacitor Cap2 and/or a third capacitor Cap3. The first end of the second capacitor Cap2 is connected to the first output end, and the second end of the second capacitor Cap2 is grounded. The first end of the third capacitor Cap3 is connected to the second output end, and the second end of the second capacitor Cap3 is grounded.

It can be understood that, by arranging the second capacitor Cap2 and/or the third capacitor Cap3 in the delay circuit 900, the influence of noise coupling in the local area network on other delay units can be reduced.

Exemplarily, after setting the second capacitor Cap2 in the delay circuit 900, the noise in the local area network can be reduced to the original $C\_gd/((C\_gd+C\_cap))$. Wherein, $C\_gd$ is the parasitic capacitance value between the gate and drain of the transistor of the power control unit in the delay unit, and $C\_cap$ is the capacitance value of the second capacitor Cap2.

In some embodiments, when the delay circuit 900 includes a plurality of delay units 201, the linear voltage stabilization unit 202 is divided into two categories, including a first linear voltage stabilization unit and a second linear voltage stabilization unit, wherein the second linear voltage stabilization unit is coupled to the control circuit, and the first linear voltage stabilization unit is in an on state; the control circuit is used to control whether the second linear voltage stabilization unit is turned on.

Exemplarily, the above-mentioned first linear voltage stabilization unit can be always on under normal circumstances, and the design power consumption is low, and is coupled to the delay unit 201 that needs to be used frequently, while the second linear voltage stabilization unit is coupled to other remaining The delay unit 201 is normally turned off to save power consumption; under certain specific operations, the second linear voltage regulator unit can be quickly turned on through the control circuit.

In the delay circuit provided in this embodiment, a plurality of linear voltage regulator units 202 are used to separately supply voltages to the delay units 201 at different positions, so as to prevent the noise of the delay units 201 at different positions from being coupled into the entire voltage network. In addition, by arranging the second capacitor and/or the third capacitor, the influence of noise coupling in the local area network on other delay units can be reduced.

In some embodiments, the above-mentioned delay circuit may further include a plurality of delay units. Wherein, when the delay circuit includes N delay units, the delay circuit may include M linear voltage stabilization units, and each linear voltage stabilization unit is respectively coupled to P different delay units; wherein, N is greater than 1, and N is a multiple of M, $P=M/N$.

Exemplarily, when the delay circuit includes 10 delay units, the delay circuit may include 5 linear voltage stabilization units, and each linear voltage stabilization unit is respectively coupled to two different delay units.

Figure 10:
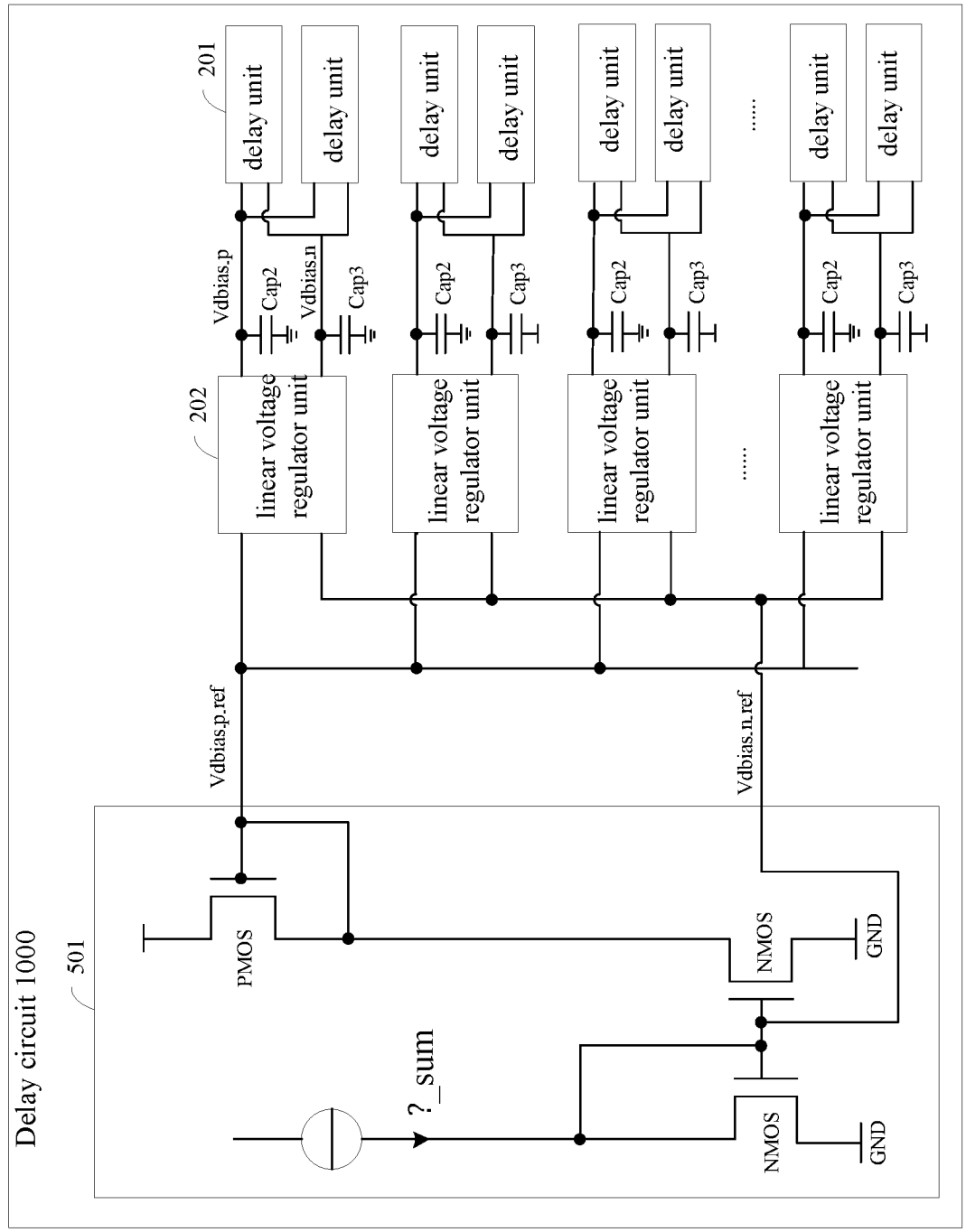
FIG. 10 is a schematic block diagram of a delay circuit 1000 according to an embodiment of the present disclosure.

For a better understanding of the embodiment of the present disclosure, refer to FIG. 10, which is a schematic block diagram of a delay circuit 1000 according to an embodiment of the present disclosure.

FIG. 10, the detailed structures of the temperature coefficient voltage generating circuit 501, the linear voltage regulator unit 202 and the delay unit 201 may refer to the contents described in the above embodiments, which will not be repeated here.

Wherein, each linear voltage regulator unit 202 is respectively coupled to two different delay units.

In some embodiments, the linear voltage regulator unit 202 includes a first output terminal and/or a second output terminal, the first output terminal is used for outputting the first power control signal Vdbias-p, and the second output terminal is used for outputting the second power supply Control signal Vdbias-n.

The above-mentioned delay circuit 900 further includes a second capacitor Cap2 and/or a third capacitor Cap3. The first end of the second capacitor Cap2 is connected to the first output end, and the second end of the second capacitor Cap2 is grounded. The first end of the third capacitor Cap3 is connected to the second output end, and the second end of the second capacitor Cap3 is grounded.

It can be understood that, by arranging the second capacitor Cap2 and/or the third capacitor Cap3 in the delay circuit 900, the influence of noise coupling in the local area network on other delay units can be reduced.

In some embodiments, when the delay circuit 1000 includes a plurality of delay units 201, the linear voltage stabilization unit 202 is divided into two categories, including a first linear voltage stabilization unit and a second linear voltage stabilization unit, wherein the second linear voltage stabilization unit is coupled to the control circuit, and the first linear voltage stabilization unit is in an on state; the control circuit is used to control whether the second linear voltage stabilization unit is turned on.

Exemplarily, the above-mentioned first linear voltage stabilization unit can be always on under normal circumstances, and the design power consumption is low, and is coupled to the delay unit 201 that needs to be used frequently, while the second linear voltage stabilization unit is coupled to other remaining The delay unit 201 is normally turned off to save power consumption; under certain specific operations, the second linear voltage regulator unit can be quickly turned on through the control circuit.

In the delay circuit provided in this embodiment, a plurality of linear voltage regulator units 202 are used to separately supply voltages to the delay units 201 at different positions, so as to prevent the noise of the delay units 201 at different positions from being coupled into the entire voltage network. In addition, by arranging the second capacitor and/or the third capacitor, the influence of noise coupling in the local area network on other delay units can be reduced.

In some embodiments, the above-mentioned multiple delay units 201 can be cascaded in sequence, the input end of the first stage delay unit 201 serves as the input end of the delay circuit, and the output end of the last stage delay unit 201 serves as the delay circuit's output. Wherein, each delay unit 201 includes an inverting unit and a power control unit.

In some embodiments, the above-mentioned delay unit 201 may include a plurality of inverting units 2011 cascaded in sequence, the input terminal of the first-stage inverting unit 2011 is used as the input terminal of the delay circuit, and the last-stage inverting unit 2011 output terminal is used as the output terminal of the delay circuit. Among them, each inverting unit 2011 shares a power control unit.

Figure 11:
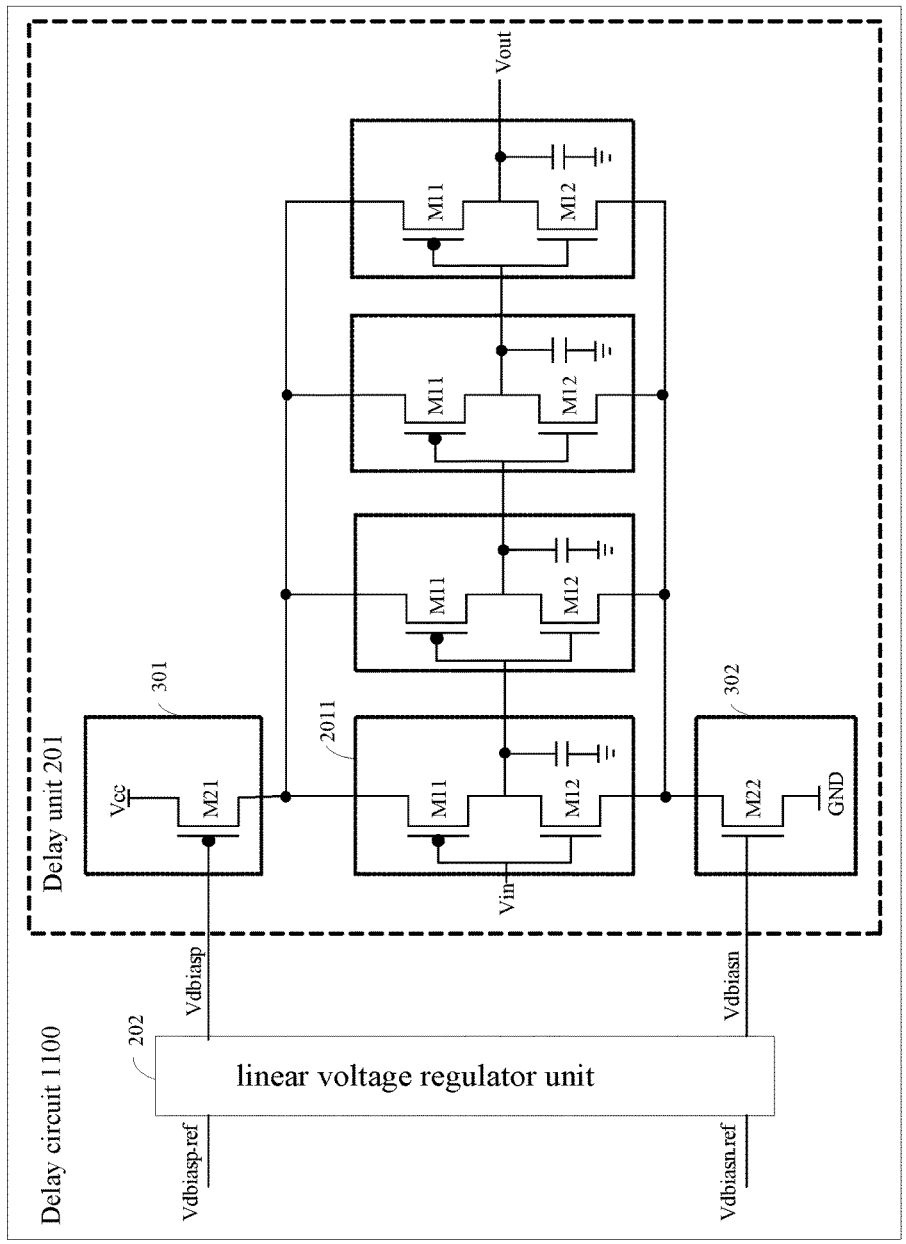
FIG. 11 is a schematic circuit diagram of a delay circuit 1100 according to an embodiment of the present disclosure.

For a better understanding of this embodiment, refer to FIG. 11, which is a schematic circuit diagram of a delay circuit 1100 according to an embodiment of the present disclosure.

In FIG. 11, the delay circuit 1100 includes a linear voltage regulator unit 202 and a delay unit 201. The delay unit 201 may include a plurality of inverting units 2011 cascaded in sequence, and each inverting unit 2011 shares the first power control unit 301 and the second power control unit 302.

Based on the content described in the foregoing embodiments, in some embodiments, the present disclosure further provides a semiconductor device, where the semiconductor device includes the delay circuit described in the foregoing embodiments, and details are not described herein again.

It should be understood that, in the several embodiments provided by the present disclosure, it should be understood that the disclosed apparatus and method may be implemented in other manners. For example, the device embodiments described above are only illustrative. For example, the division of the modules is only a logical function division. In actual implementation, there may be other division methods. For example, multiple modules may be combined or integrated. to another system, or some features can be ignored, or not implemented. On the other hand, the shown or discussed mutual coupling or direct coupling or communication connection may be through some interfaces, indirect coupling or communication connection of devices or modules, and may be in electrical, mechanical or other forms.

The modules described as separate components may or may not be physically separated, and components shown as modules may or may not be physical units, that is, may be located in one place, or may be distributed to multiple network units. Some or all of the modules may be selected according to actual needs to achieve the purpose of the solution in this embodiment.

In addition, each functional module in each embodiment of the present disclosure may be integrated in one processing unit, or each module may exist physically alone, or two or more modules may be integrated in one unit. The units formed by the above modules can be implemented in the form of hardware, or can be implemented in the form of hardware plus software functional units.

Finally, it should be noted that the above embodiments are only used to illustrate the technical solutions of the present disclosure, but not to limit them; although the present disclosure has been described in detail with reference to the foregoing embodiments, those of ordinary skill in the art should understand that: The technical solutions described in the foregoing embodiments can still be modified, or some or all of the technical features thereof can be equivalently replaced; and these modifications or replacements do not make the essence of the corresponding technical solutions deviate from the technical solutions of the embodiments of the present disclosure scope.

The invention claimed is:

1. A delay circuit, comprising:
a delay unit, wherein the delay unit comprises an inversion unit and a first power supply control unit and a second power supply control unit, wherein the inversion unit receives an input signal and delays the input signal;
a temperature coefficient voltage generating circuit, comprising a first NMOS, a second NMOS and a PMOS; wherein the temperature coefficient voltage generating circuit generates a negative temperature coefficient voltage from the first NMOS and the second NMOS or a positive temperature coefficient voltage from the PMOS; and
a linear voltage regulator unit, coupled to the delay unit, wherein the linear voltage regulator unit inputs the positive temperature coefficient voltage and outputs a first power supply control signal according to the positive temperature coefficient voltage; and/or the linear voltage regulator unit inputs the negative temperature coefficient voltage and outputs a second power supply control signal according to the negative temperature coefficient voltage;
wherein the inversion unit receives a power supply voltage based on the first power supply control signal from the first power supply control unit, and wherein the inversion unit receives a ground voltage based on the second power supply control signal from the second power supply control unit.

2. The delay circuit according to claim 1, wherein the inverting unit comprises a first transistor, a second transistor, and a first capacitor, and wherein a channel type of the first transistor and a channel type of he second transistor are different;
wherein a gate of the first transistor is connected to a gate of the second transistor and receives the input signal, wherein a drain of the first transistor is connected to a drain of the second transistor and serves as an output terminal of the delay unit, wherein a source of the first transistor and/or a source of the second transistor receive the voltage; wherein one terminal of the first capacitor is connected to the output terminal of the delay unit, wherein the first capacitor is connected to the output terminal of the delay unit, and wherein another terminal of the first capacitor is grounded.

3. The delay circuit according to claim 2,
wherein the first power supply control unit is configured to provide the power supply voltage to the source of the first transistor according to the first power supply control signal; and
wherein the second power supply control unit is configured to provide the ground voltage to the source of the second transistor according to the second power supply control signal.

4. The delay circuit according to claim 3, wherein the first power supply control unit comprises a third transistor, wherein a channel type of the third transistor and the channel type of the first transistor are same, and wherein a source of the third transistor is connected to the first power supply control unit, wherein a drain of the third transistor is connected to the source of the first transistor, and wherein a gate of the third transistor receives the first power supply control signal;
wherein the second power supply control unit comprises a fourth transistor, wherein a channel type of the fourth transistor and the channel type of the second transistor are same, wherein a source of the fourth transistor is grounded, and wherein a drain of the fourth transistor is connected to the source of the second transistor, and wherein the gate of the fourth transistor receives the second power supply control signal.

5. The delay circuit according to claim 4, wherein the first power supply control unit is powered by a low-dropout linear regulator, and wherein an input reference voltage of the low-dropout linear regulator adopts a bandgap reference voltage.

6. The delay circuit according to claim 4, wherein the temperature coefficient voltage generating circuit receives a zero temperature coefficient current, and wherein the temperature coefficient voltage generating circuit generates the positive temperature coefficient voltage and/or the negative temperature coefficient voltage according to the zero temperature coefficient current.

7. The delay circuit according to claim 6, wherein the zero temperature coefficient current is formed by using a positive temperature coefficient current and a negative temperature coefficient current, and wherein the zero temperature coefficient current does not change with a temperature change.

8. The delay circuit according to claim 6,
wherein a gate of the first NMOS is connected to a gate of the second NMOS, a source of the first NMOS is grounded, a drain of the first NMOS and the connected gates of the first NMOS and the second NMOS receive the zero temperature coefficient current;
wherein a source of the second NMOS is grounded, the drain of the second NMOS is connected to a drain and a gate of the PMOS, respectively, and wherein the commonly connected gates of the first NMOS and the second NMOS output the negative temperature coefficient voltage; and
wherein a source of the PMOS is connected to a preset voltage, and wherein a gate of the PMOS outputs the positive temperature coefficient voltage.

9. The delay circuit according to claim 8, wherein the linear voltage regulator unit is configured to output the first power supply control signal according to the positive temperature coefficient voltage, and/or configured to output the second power supply control signal according to the negative temperature coefficient voltage.

10. The delay circuit according to claim 8, wherein the linear voltage regulator unit comprises a first output terminal and/or a second output terminal, wherein the first output terminal outputs the first power supply control signal, and the second output terminal outputs the second power supply control signal;
wherein the delay circuit further comprises a second capacitor and/or a third capacitor, wherein a first terminal of the second capacitor is connected to the first output terminal of the linear voltage regulator unit, and wherein a second terminal of the second capacitor is grounded; and
wherein a first terminal of the third capacitor is connected to the second output terminal of the linear voltage regulator unit, and wherein the second terminal of the second capacitor is grounded.

11. The delay circuit according to claim 10, wherein the linear voltage regulator unit comprises a voltage follower circuit.

12. The delay circuit according to claim 10, wherein when the delay circuit comprises N delay units, the delay circuit comprises N linear voltage regulator units, wherein different linear voltage regulator units are coupled to the different N delay units; and wherein N is an integer greater than 1.

13. The delay circuit according to claim 10, wherein when the delay circuit comprises N delay units, the delay circuit comprises M linear voltage regulator units, wherein each time the linear voltage regulator units are respectively coupled to P different delay units; and wherein, N is an integer greater than 1, and N is a multiple of M, and P=M/N.

14. The delay circuit according to claim 10, wherein when the delay circuit comprises multiple delay units, the linear voltage regulator unit comprises a first linear voltage regulator unit, a second linear voltage regulator unit, and a control circuit; and
wherein the first linear voltage regulator unit is in an on state, the control circuit controls whether the second linear voltage regulator unit is turned on.

15. A semiconductor device, comprising the delay circuit according to claim 1.

* * * * *